United States Patent
Tsukada et al.

(10) Patent No.: US 10,668,593 B2
(45) Date of Patent: Jun. 2, 2020

(54) WORK POLISHING HEAD

(71) Applicant: Fujikoshi Machinery Corp., Nagano (JP)

(72) Inventors: Masayuki Tsukada, Nagano (JP); Kazutaka Shibuya, Nagano (JP); Takayuki Fuse, Nagano (JP)

(73) Assignee: FUJIKOSHI MACHINERY CORP., Nagano (JP)

( * ) Notice: Subject to any disclaimer, the term of this patent is extended or adjusted under 35 U.S.C. 154(b) by 301 days.

(21) Appl. No.: 15/834,983

(22) Filed: Dec. 7, 2017

(65) Prior Publication Data

US 2018/0193975 A1  Jul. 12, 2018

(30) Foreign Application Priority Data

Jan. 10, 2017  (JP) .................................. 2017-001879

(51) Int. Cl.
| | |
|---|---|
| *B24B 37/10* | (2012.01) |
| *B24B 37/30* | (2012.01) |
| *B24B 37/32* | (2012.01) |
| *B24B 37/005* | (2012.01) |
| *B24B 37/04* | (2012.01) |
| *H01L 21/304* | (2006.01) |

(52) U.S. Cl.
CPC ............ *B24B 37/32* (2013.01); *B24B 37/005* (2013.01); *B24B 37/04* (2013.01); *B24B 37/10* (2013.01); *B24B 37/30* (2013.01); *H01L 21/304* (2013.01)

(58) Field of Classification Search
CPC ....... B24B 37/005; B24B 37/04; B24B 37/10; B24B 37/30; B24B 37/32
USPC ................... 451/41, 285, 287, 288, 398
See application file for complete search history.

(56) References Cited

U.S. PATENT DOCUMENTS

| | | | | |
|---|---|---|---|---|
| 5,804,507 | A * | 9/1998 | Perlov .................... | B24B 57/02 134/33 |
| 5,916,015 | A * | 6/1999 | Natalicio ............ | B24B 37/0053 451/288 |
| 6,056,632 | A * | 5/2000 | Mitchel .................. | B24B 37/30 451/286 |
| 6,102,777 | A * | 8/2000 | Duescher ............... | B24B 37/04 451/262 |

(Continued)

FOREIGN PATENT DOCUMENTS

| | | |
|---|---|---|
| JP | H06126615 | 5/1994 |
| JP | H06198561 | 7/1994 |
| JP | 2003311607 | 11/2003 |

*Primary Examiner* — Eileen P Morgan
(74) *Attorney, Agent, or Firm* — Stephen J. Weyer, Esq.; Stites & Harbison, PLLC

(57) ABSTRACT

The polishing head comprises: a head main body part; a carrier being connected to the head main body part; a pressure chamber; a fluid supplying section; a linear motion guide having an outer cylindrical body and a spline shaft, which is provided in the outer cylindrical body and capable of moving in an axial direction thereof, and which is prohibited to rotate with respect to the outer cylindrical body so as to transmit a rotational force to the spline shaft through the outer cylindrical body; and a rotation transmitting plate being provided between a lower end of the spline shaft and an upper face of the carrier, the rotation transmitting plate being capable of tiltably supporting the carrier and transmitting a rotational force of the spline shaft to the carrier.

15 Claims, 6 Drawing Sheets

(56) References Cited

U.S. PATENT DOCUMENTS

| | | | | |
|---|---|---|---|---|
| 6,110,025 | A * | 8/2000 | Williams | B24B 49/16 451/286 |
| 6,116,990 | A * | 9/2000 | Sinclair | B24B 41/047 384/193 |
| 6,143,127 | A * | 11/2000 | Perlov | B24B 37/32 156/345.14 |
| 6,183,354 | B1 * | 2/2001 | Zuniga | B24B 37/32 451/285 |
| 6,676,497 | B1 * | 1/2004 | Chen | B24B 37/12 451/286 |
| 2002/0132559 | A1 * | 9/2002 | Togawa | B24B 37/30 451/8 |
| 2003/0181151 | A1 * | 9/2003 | Chao | B24B 37/30 451/287 |
| 2006/0025058 | A1 * | 2/2006 | Tseng | B24B 37/30 451/288 |
| 2014/0370787 | A1 * | 12/2014 | Duescher | B24B 37/30 451/41 |

* cited by examiner

BIRD'S-EYE VIEW

CONTOUR GRAPHIC

BIRD'S-EYE VIEW

CONTOUR GRAPHIC

BIRD'S-EYE VIEW

CONTOUR GRAPHIC

BIRD'S-EYE VIEW

CONTOUR GRAPHIC

WORK POLISHING HEAD

CROSS-REFERENCE TO RELATED APPLICATION

This application is based upon and claims the benefit of priority of the prior Japanese Patent Application No. 2017-001879, filed on Jan. 10, 2017, and the entire contents of which are incorporated herein by reference.

FIELD

The present invention relates to a polishing head which is capable of precisely polishing a work, e.g., semiconductor wafer.

BACKGROUND

Polishing a work, e.g., semiconductor wafer, is performed by steps of: holding a work by a polishing head; pressing a surface of the work to be polished onto a surface of a polishing pad adhered on a polishing plate; and rotating the polishing plate and the polishing head with supplying slurry onto the polishing pad.

To improve accuracy of polishing the work, the polishing head can be tilted so as to move along a surface configuration (e.g., waviness) of the polishing pad (see PTL 1: JP-A-H06-126615, PTL 2: JP-A-H06-198561 and PTL 3: JP-A-2003-311607).

In PTL 1, a carrier (plate) is suspended from a head main body part through a tough and ring-shaped elastic plate (e.g., diaphragm), so that the carrier can be moved upward and downward and can be tilted. Further, a rotational force of the head main body part is transmitted to the carrier through the elastic plate or a ring-shaped elastic member (e.g., O-ring) provided between the head main body part and the carrier.

In PTL 2, a carrier (main body of a top ring) is tiltably supported, with respect to a head main body part (drive shaft), with a ball bearing. Further, a rotational force of the head main body part is transmitted to the carrier by a pin.

In PTL 3, a carrier (backing assembly) is suspended from a head main body part (housing) through a ring-shaped rolling diaphragm, so that the carrier can be moved upward and downward. Further, the carrier is tiltably supported by a gimbal mechanism having a flexure ring. A rotational force of the head main body part is transmitted to the carrier through the rolling diaphragm.

In PTL 1, the rotational force of the head main body part cannot be suitably transmitted to the carrier through the ring-shaped elastic member (e.g., O-ring) only. Actually, the elastic plate (e.g., diaphragm) mainly transmits the rotational force. Thus, the elastic plate must be composed of a tough material, but the carrier cannot be suitably tilted. Further, when the carrier follows surface configuration of the polishing pad, a load applied to a polishing pad from the carrier is varied due to tension of the tough elastic plate, so the polishing pad cannot be evenly pressed.

In PTL 3, the rotational force is transmitted to the carrier through the rolling diaphragm, the rolling diaphragm must have relatively high toughness capable of transmitting the rotational force, so the carrier cannot suitably tilt. Therefore, the polishing pad cannot be evenly pressed as well as PTL 1.

Further, in PTL 2, the carrier is tiltably supported by the tough ball bearing, so applying pressure from the carrier to a polishing pad cannot be precisely controlled.

SUMMARY

The present invention has been invented to solve the above described problems of the conventional technologies. Thus, an object of the present invention is to provide a polishing head, in which a rotational force of a head main body part can be suitably transmitted to a carrier, the carrier can suitably follow surface configuration of a polishing pad and a work can be precisely polished.

To achieve the object, the present invention has following structures.

Namely, the polishing head, which holds a work on a lower face and presses the work on a polishing pad of a rotating polishing plate, comprises:

a head main body part;

a carrier having a lower face on which the work can be held, the carrier being connected to the head main body part with a ring-shaped flexible diaphragm;

a pressure chamber enclosed by a lower face of the head main body part, the diaphragm and an upper face of the carrier;

a fluid supplying section for supplying a fluid to the pressure chamber;

a linear motion guide having an outer cylindrical body, which is fixed to the head main body part and coaxially arranged therewith, and a spline shaft, which is provided in the outer cylindrical body and capable of moving in an axial direction thereof, and which is prohibited to rotate, about an axis, with respect to the outer cylindrical body so as to transmit a rotational force to the spline shaft through the outer cylindrical body; and a rotation transmitting plate being provided between a lower end of the spline shaft and the upper face of the carrier, the rotation transmitting plate being capable of tiltably supporting the carrier and transmitting a rotational force of the spline shaft to the carrier.

In the polishing head, the linear motion guide may be a ball-spline.

In the polishing head, the rotation transmitting plate may be a ring-shaped plate, which is connected to a flange part provided to the lower end of the spline shaft and an upper edge of a cylindrical part provided in the upper face of the carrier.

In the polishing head, a chamber formed between the flange part, the rotation transmitting plate, the cylindrical part and the upper face of the carrier may be preferably communicated to the pressure chamber so as to evenly apply pressure.

In the polishing head, the carrier may include:

a carrier main body part;

a holding plate, which is attached to a lower face of the carrier main body part with forming an air chamber and which has a plurality of through-holes being communicated to the air chamber and opened in a lower face; and a supply/discharge path for supplying air to and discharging air from the air chamber.

In the polishing head, the holding plate may be a ceramic plate, which is attached to the carrier main body part with a ring-shaped elastic body having an X-shaped section.

In the polishing head, the carrier may include:

a carrier main body part;

a holding plate, which is attached to a lower face of the carrier main body part with forming an air chamber and which has a plurality of through-holes being communicated to the air chamber and opened in a lower face;

a retainer ring being provided to an outer circumference of a lower face of the carrier main body part, the retainer ring enclosing the work and contacting the polishing pad of the polishing plate while polishing the work;

an elastic membrane member covering the lower face of the holding plate and being fixed to the retainer ring at an outer circumferential part;

a second pressure chamber enclosed by the lower face of the holding plate, an inner circumferential face of the retainer ring and an upper face of the elastic membrane member; and a flow path for supplying air to the second pressure chamber via the air chamber and the through-holes.

In the polishing head, the retainer ring may have a ring-shaped template, which encloses the work and contacts the polishing pad of the polishing plate while polishing the work.

In the polishing head, the retainer ring may have a flow path for pressing the template by a fluid pressure.

In the polishing head, the linear motion guide may prohibit side shift of the carrier, which is caused by a frictional force while polishing, and centers the same.

In the polishing head, the head main body part and the carrier may be connected to each other by a flexible diaphragm, a height (distance) from the head main body part to the carrier may be varied, the height may be varied within a range of ±1.5 mm, and an amount of varying a load applied to the polishing pad after varying the height may be within ±2% with respect to the load applied when the height is a standard value.

In the polishing head, when a height of the head main body part is adjusted for polishing the work, the height of the head main body part may be allowed to varied within ±1.5 mm from a standard position, so a load applied when the height of the head main body part is located at the standard position can be maintained By the present invention, the linear motion guide and the rotation transmitting plate separately have the function of varying the height between the head main body part and the carrier and the function of tilting the carrier with respect to a horizontal plane. The rotation transmitting plate has not only the function of tilting the carrier with respect to the horizontal plane but also a function of making the carrier vertically follow surface configuration (e.g., waviness, uneven surface) of the polishing pad.

By the above described structures, the carrier can be highly suitably moved upward and downward. A structure of the rotation transmitting plate having enough toughness for transmitting the rotational force and flexibility for tilting with respect to the horizontal plane can be simplified. By employing the simple rotation transmitting plate, the pressing force from the carrier to the polishing pad and tilting the carrier can be precisely and easily adjusted.

BRIEF DESCRIPTION OF THE DRAWINGS

Embodiments of the present invention will now be described by way of examples and with reference to the accompanying drawings, in which.

DESCRIPTION OF THE EMBODIMENTS

Preferred embodiments of the present invention will now be described in detail with reference to the accompanying drawings.

Figure 1:
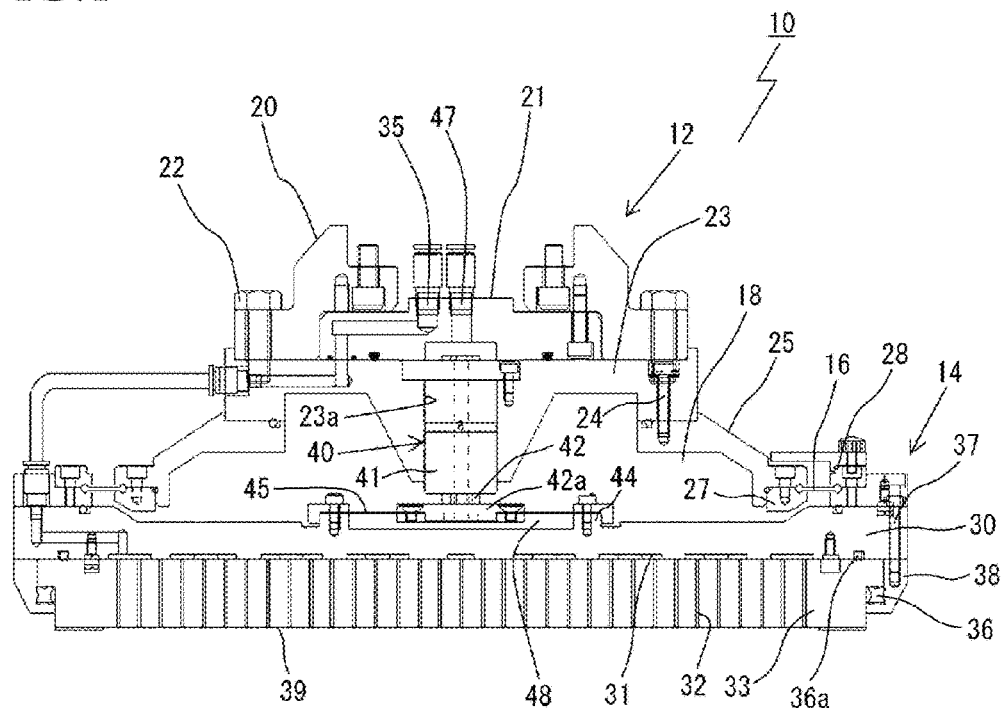
FIG. 1 is a sectional view of a polishing head of a first embodiment.
Figure 2:
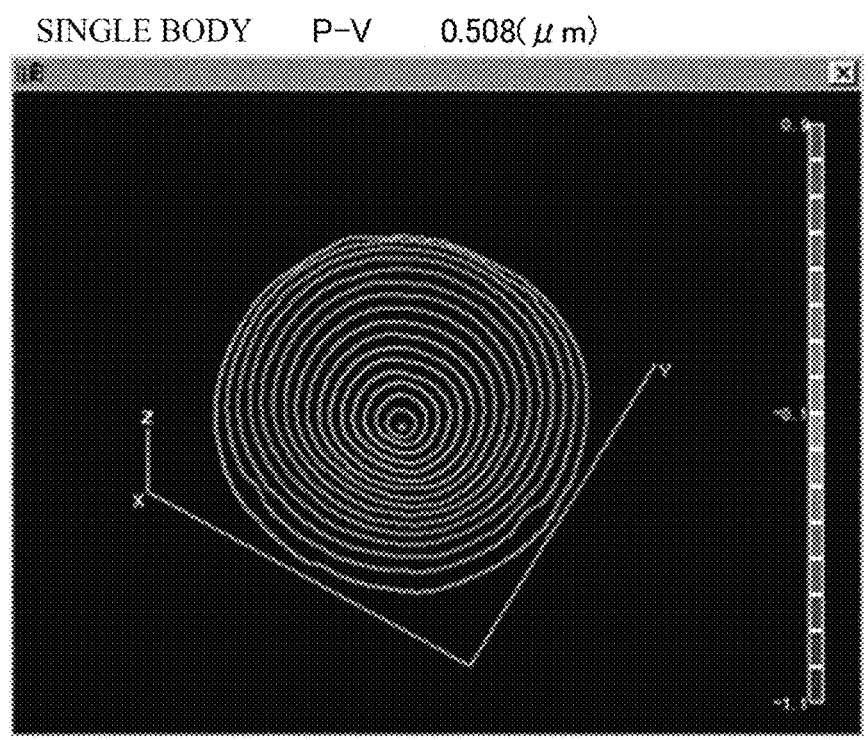
FIG. 2 is a bird's-eye view showing a shape measuring result of a ceramic plate (holding plate) single body used in the polishing head of the first embodiment (Rotational angle=30.0°, Elevation angle=70.0°, All measurement points plotted)
Figure 3:
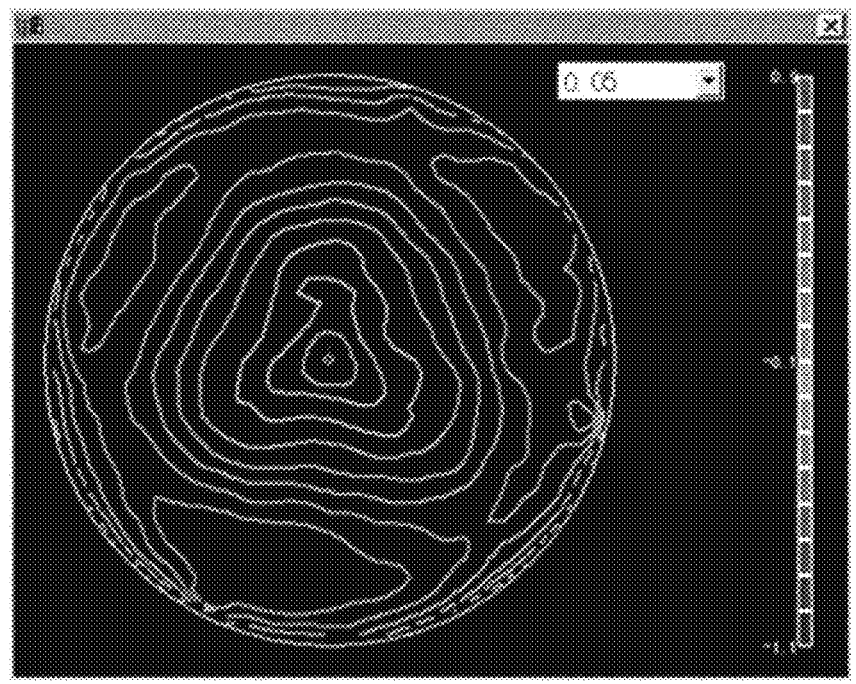
FIG. 3 is a contour graphic showing a shape measuring result of the ceramic plate (holding plate) single body used in the polishing head of the first embodiment.
Figure 4:
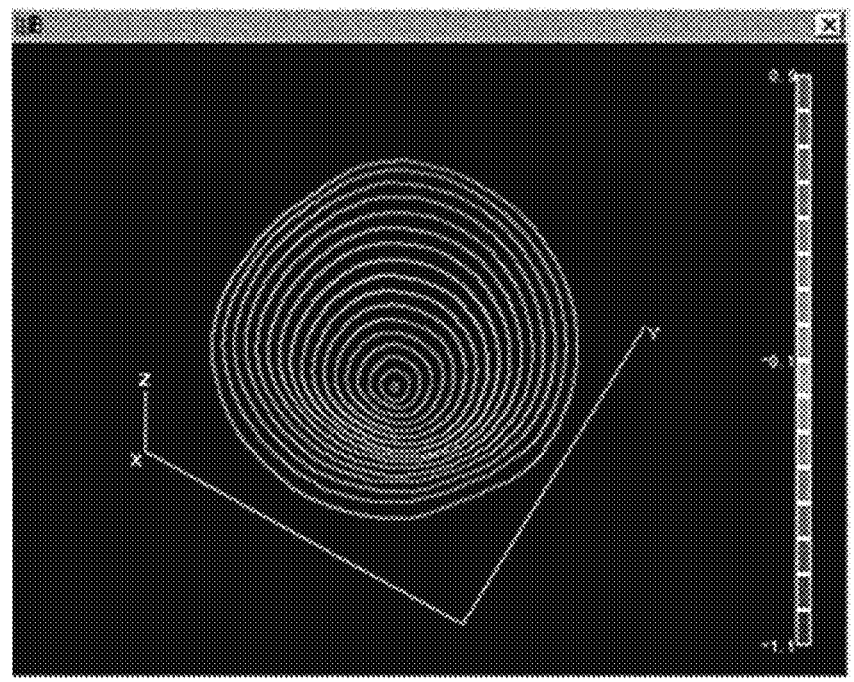
FIG. 4 is a bird's-eye view showing a shape measuring result of the fixed ceramic plate (holding plate) used in the polishing head of the first embodiment (Rotational angle=30.0°, Elevation angle=70.0°, All measurement points plotted)
Figure 5:
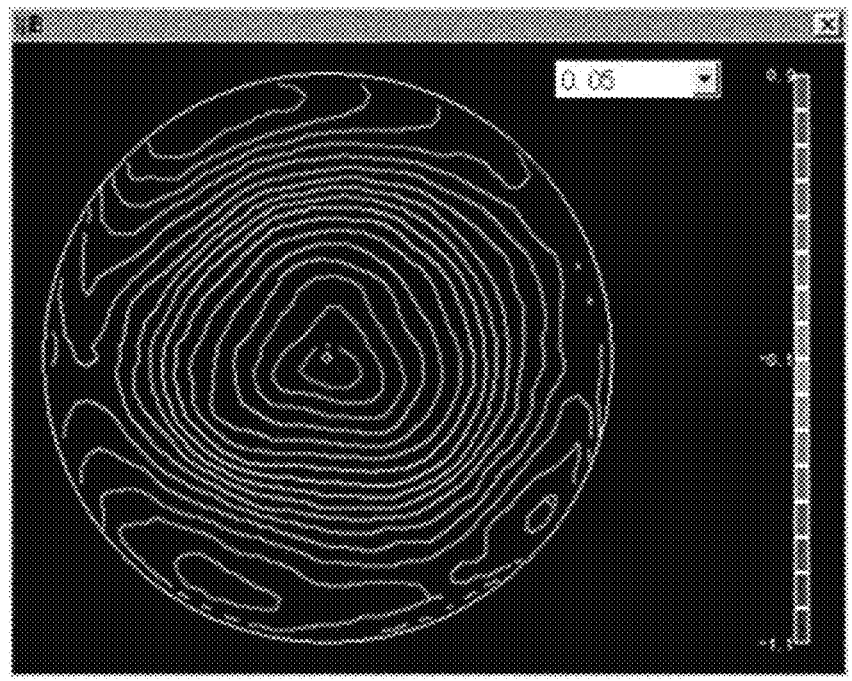
FIG. 5 is a contour graphic showing a shape measuring result of the fixed ceramic plate (holding plate) used in the polishing head of the first embodiment.
Figure 6:
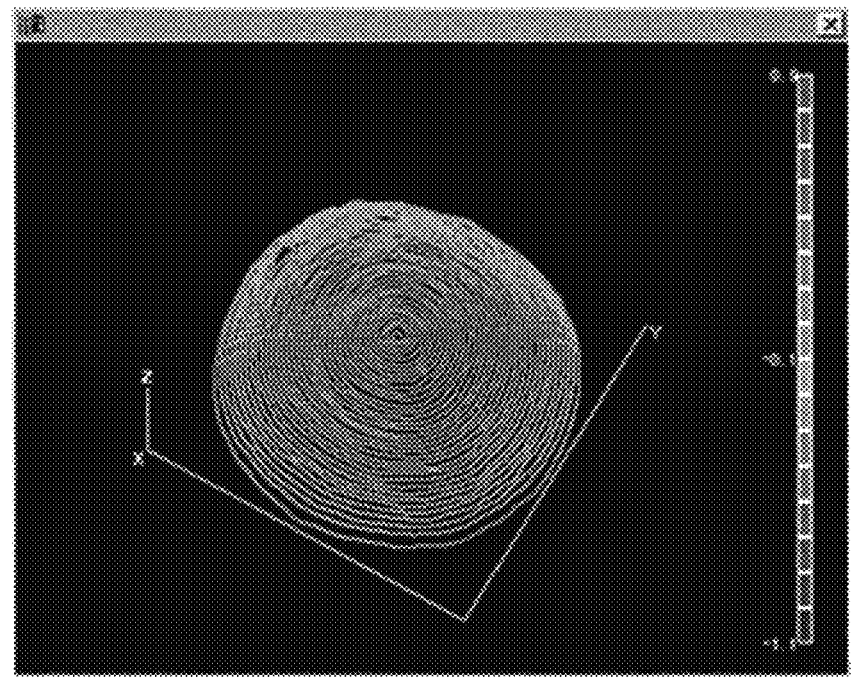
FIG. 6 is a bird's-eye view showing a shape measuring result of a ceramic plate (holding plate) single body used in a conventional polishing head (Rotational angle=30.0°, Elevation angle=70.0°, All measurement points plotted)
Figure 7:
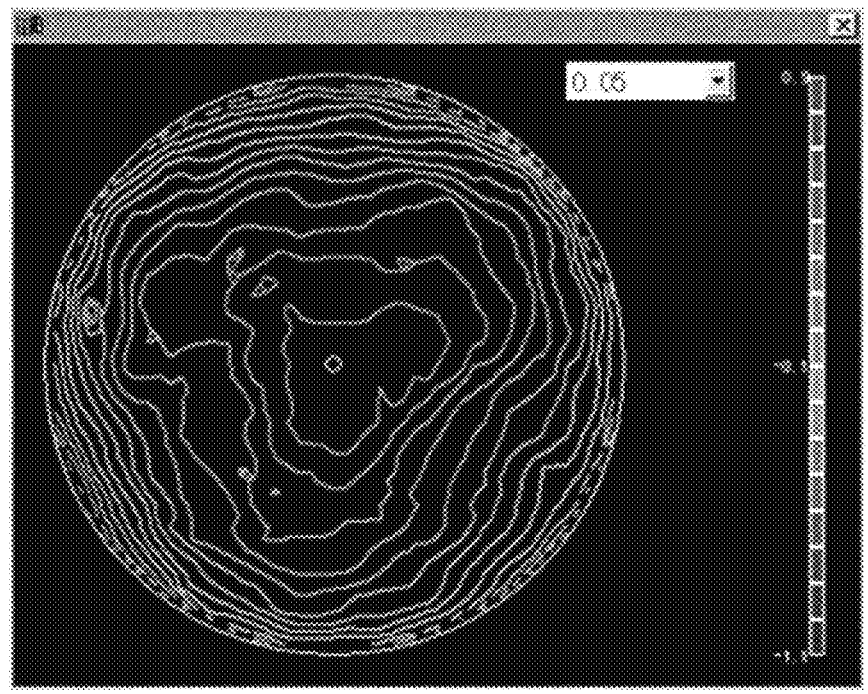
FIG. 7 is a contour graphic showing a shape measuring result of the ceramic plate (holding plate) single body used in the conventional polishing head.
Figure 8:
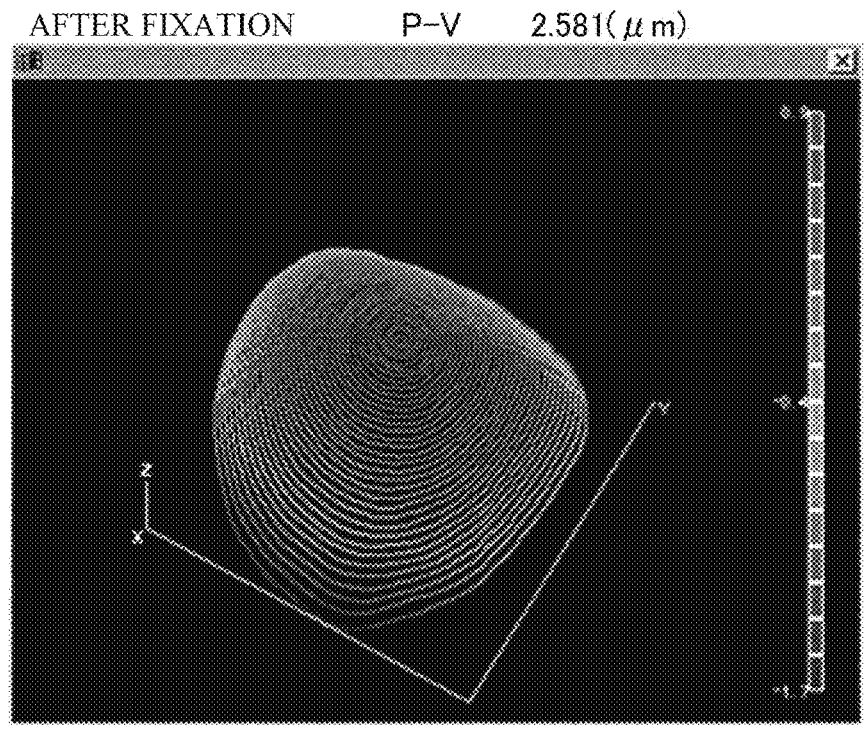
FIG. 8 is a bird's-eye view showing a shape measuring result of the fixed ceramic plate (holding plate) used in the conventional polishing head (Rotational angle=30.0°, Elevation angle=70.0°, All measurement points plotted)
Figure 9:
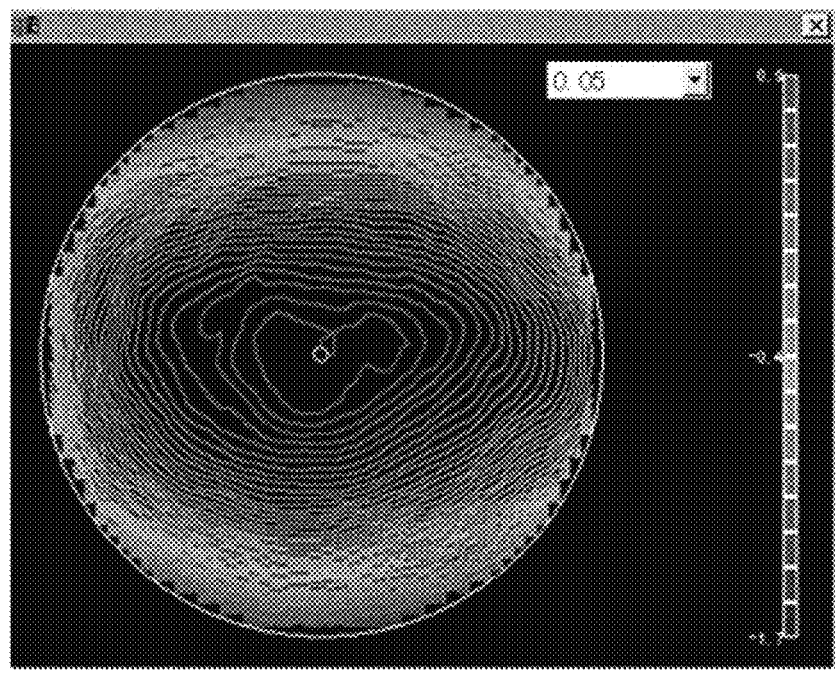
FIG. 9 is a contour graphic showing a shape measuring result of the fixed ceramic plate (holding plate) used in the conventional polishing head.

FIG. 1 is a sectional view of a polishing head 10 of a first embodiment.

In the polishing head 10, a work (not shown) to be polished is held on a lower face of a carrier 12 and pressed onto a polishing pad adhered on an upper face of a polishing plate (not shown). The polishing head 10 and the polishing plate are rotated in prescribed directions, with supplying slurry from a slurry supplying section (not shown) to the polishing pad, so that the work can be polished.

A symbol 12 stands for a head main body part. A carrier 14 is connected to the head main body part 12 through a ring-shaped diaphragm 16, which is composed of a flexible material, e.g., rubber, and the work can be held on the lower face of the carrier 14.

A space enclosed by a lower face of the head main body part 12, a lower face of the diaphragm 16 and an upper face of the carrier 14 is formed as a pressure chamber 18. Note that, diaphragms having other shapes (e.g., cylindrical shape) may be employed instead of the ring-shaped diaphragm.

The head main body part 12 includes: a ring-shaped member 20; a circular plate member 21 assembled in the ring-shaped member 20; a supporting member 23 fixed to lower faces of the ring-shaped member 20 and the circular plate member 21 by bolts 22; and a skirt-shaped part 25 fixed to a lower face of the supporting member 23 by bolts 24.

The diaphragm 16 is formed into a ring shape, its inner edge part is clamped and fixed to a lower end face of the skirt-shaped part 25 by a fixing member 27, and its outer edge part is clamped and fixed to an upper edge part of the carrier 14 by a fixing member 28.

The carrier 14 having a known structure may be employed.

In the first embodiment, the carrier 14 includes a carrier main body part 30, and a holding plate 33 which is attached to a lower end face of the carrier main body part 30 with forming air chambers 31. A plurality of through-holes 32 are formed in the holding plate 33, communicated to the air chambers 31 and opened in a lower face of the holding plate 33.

Air is supplied to and discharged from the air chambers 31 via a supply/discharge path 35.

The holding plate 33 is composed of ceramic and attached to the carrier main body part 30, with a ring-shaped elastic body 36 having an X-shaped section, by bolts 37 and a fixing member 38. A small ring-shaped elastic body 36a is provided between the holding plate 33 and the carrier main body part 30 so as to seal a gap therebetween. It is preferable that the small ring-shaped elastic body 36a also has an X-shaped section.

By attaching the holding plate 33 with the elastic bodies 36 and 36a having the X-shaped sections, a clamping force can be effectively absorbed, so that distorting the ceramic holding plate 33 can be suitably prevented. Note that, if an amount of distorting the holding plate 33 is previously considered, the elastic members 36 and 36a may be O-rings.

A backing member 39 is adhered on a lower face of the holding plate 33.

The work (not shown) will be held on a lower face of the backing member 39 by water-sticking or held by sucking air through the air chambers 31 and the through-holes 32 without using the backing member 39.

Note that, it is preferable that a lower outer edge of the ceramic plate is chamfered.

In the first embodiment, a linear motion guide 40 is constituted by a known ball-spline. The ball-spline comprises an outer cylindrical body 41 and a spline shaft 42, which is provided in the outer cylindrical body 41 and capable of moving in an axial direction thereof and whose rotation about an axial line with respect to the outer cylindrical body 41 is prohibited. In the ball-spline, many steel balls (not shown) are provided between the spline shaft 42 and the outer cylindrical body 41 and the steel balls are moved and circulated, so that an axial movement of the spline shaft 42 can be highly smoothly performed.

In the first embodiment, the outer cylindrical body 41 is located in a center hole 23a of the supporting member 23 of the head main body part 12 and fixed to the supporting member 23. With this structure, a rotational force of the head main body part 12 can be suitably and securely transmitted to the spline shaft 42 through the outer cylindrical body 41.

Note that, the linear motion guide 40 need not be the ball-spline. For example, a mere spline unit comprising an outer cylindrical body and a spline shaft guided by the outer cylindrical body may be employed.

A flange part 42a is fixed to a lower end of the spline shaft 42.

Further, a low cylindrical part 44, which encloses the flange part 42a, is formed in the upper face of the carrier 14.

A ring-shaped rotation transmitting plate 45 is connected to the flange part 42a and an upper edge of the cylindrical part 44. Namely, an inner edge of the rotation transmitting plate 45 is fixed to the flange part 42a by screws; an outer edge thereof is fixed to the upper edge of the cylindrical part 44 by bolts.

Therefore, a rotational force of the spline shaft 42 can be transmitted to the carrier 14 through the rotation transmitting plate 45.

The rotation transmitting plate 45 may be composed of steel (e.g., SUS), cloth-containing diaphragm (NBR rubber), CFRP, etc. For example, the rotation transmitting plate 45 is composed of a thin SUS plate having a thickness of about 0.5 mm and having enough toughness and flexibility. By employing such rotation transmitting plate 45, a gimbal function can be obtained, so that the carrier 14 can tilt and follow surface configuration (e.g., waviness, uneven surface) of the polishing pad of the polishing plate (not shown).

With the above described structure, a tilting center of the carrier 14 can be located close to the polishing pad (i.e., lowering a gravity center), and a phenomenon of hooking the wafer with the polishing pad (i.e., stumbling) can be restrained, so that stability of polishing can be improved.

A fluid, e.g., compressed air, is supplied into the pressure chamber 18 via a flow path 47 formed in the circular plate member 21 and a flow path (not shown) formed in the supporting member 23, so that the carrier 14 and the work (not shown) can be pressed onto the polishing pad of the polishing plate with applying a prescribed pressing force.

A fluid supplying section for supplying a fluid to the pressure chamber 18 includes the flow path 47 and the flow path (not shown) formed in the supporting member 23.

In the present embodiment, the spline shaft 42 is a hollow shaft, so the fluid is supplied into a chamber 48, which is formed between the flange part 42a, the rotation transmitting plate 45, the cylindrical part 44 and the upper face of the carrier main body part 30, via the flow path 47 and the spline shaft 42. With this structure, the entire upper face of the carrier main body part 30 can be evenly pressed.

The polishing head 10 of the first embodiment has the above described structure.

As described above, the work is held on the lower face of the backing member 39 provided on the lower face of the holding plate 33 of the carrier 14, the work is pressed onto the polishing pad of the polishing plate (not shown), and the polishing plate and the polishing head 10 are rotated in prescribed directions with supplying slurry onto the polishing pad from a slurry supplying section (not shown), so that the work can be polished. While polishing the work, the carrier 14 is capable of following the surface configuration (e.g., waviness, uneven surface) of the polishing pad by the tilting mechanism including the spline shaft 42, the rotation transmitting plate 45, etc., so that the work can be precisely polished.

In the first embodiment, the rotational force from the head main body part 12 is not transmitted by the diaphragm 16, so the diaphragm 16 need not be composed of a tough material. Therefore, the diaphragm 16 may be composed of a flexible material, so that the carrier 14 can vertically follow the surface configuration of the polishing pad without being disturbed. Further, the carrier 14 is connected to the spline shaft 42 of the linear motion guide 40 by the rotation transmitting plate 45, so that the function of varying a height (distance) from the head main body part 12 to the carrier 14 is not disturbed.

The function of the carrier 14 of tilting and vertically following the surface configuration (e.g., waviness, uneven surface) of the polishing pad is combination of: the vertical following action of the carrier 14 with respect to the polishing pad; and the tilting action thereof with respect to a horizontal plane. In the first embodiment, the linear motion guide 40 and the rotation transmitting plate 45 separately have the function of varying the height between the head main body part 12 and the carrier 14 and the function of tilting the carrier 14 with respect to the horizontal plane. The rotation transmitting plate 45 has the function of tilting the carrier 14 with respect to the horizontal plane, and the rotation transmitting plate 45 simultaneously has the function of making the carrier 14 vertically follow waviness and uneven surface of the polishing pad.

With the above described structure, the carrier 14 has the superior function of vertically following the surface configuration.

Further, requirements of the rotation transmitting plate may be only a certain toughness for transmitting the rotational force and a certain flexibility for tilting in the horizontal plane.

Therefore, as described above, the simple rotation transmitting plate 45 which is formed into the ring shape and composed of the thin SUS having a thickness of 0.5 mm may be used. With this simple structure, adjusting the pressing force of the carrier 14 applied to the polishing pad, the function of vertically following the surface configuration and the tilting function can be easily performed.

The shape of the rotation transmitting plate 45 is not limited to the ring shape. For example, a member radially connecting the flange part 42a to the cylindrical part 44 may be employed.

The linear motion guide 40 further has a function of restraining side shift of the carrier, which is caused by a frictional force while polishing, and centering the carrier.

Measured data of variation ratios of load applied from the carrier to the polishing pad relating to the conventional polishing head disclosed in PTL 1 and the polishing head 10 of the first embodiment are shown in TABLE 1.

Note that, in case of the conventional polishing head of PTL 1, a position at which the elastic plate is in a horizontal state is a standard position; in case of the polishing head 10 of the first embodiment, a position at which the diaphragm 16 is in a horizontal state is a standard position. In each of cases, the variation ratio is a ratio of varying load with respect to load at the standard position when the head main body part is moved upward and downward from the standard position. In TABLE 1, an item "0.5 mm up" means that the head main body part is located at a position 0.5 mm higher than the standard position; and an item "0.5 mm down" means that the head main body part is located at a position 0.5 mm lower than the standard position. Note that, a fluid pressure in the pressure chamber was varied within a practical range, and it was considered that the obtained load was up to about 230 kgf.

TABLE 1

|  | First Embodiment | Conventional Polishing Head |
| --- | --- | --- |
| 0.5 mm up | −0.43% | −0.84% |
| 1.0 mm up | −0.87% | −1.69% |
| 1.5 mm up | −1.74% | −6.75% |
| 0.5 mm down | 0% | — |
| 1.0 mm down | 0% | — |
| 1.5 mm down | 0% | — |

As clearly known from TABLE 1, in the polishing head 10 of the first embodiment, even if the height of the head main body part was varied, the variation of the load applied to the polishing pad was small. In case of the first embodiment, the carrier 14 is connected to the spline shaft 42 and capable of vertically moving with respect to the head main body part 12. Thus, the variation of the load applied to the polishing pad was very small with respect to the vertical movement of the head main body part 12. On the other hand, in case of the conventional polishing head, tension of the tough elastic plate was varied when a height of the head main body part is varied, so the variation of tension affected the carrier connected to the elastic plate and the variation of the load applied to the polishing pad was large.

FIGS. 2-9 show shape measuring results (i.e., bird's-eye views and contour graphics) of: a ceramic plate single body and a fixed ceramic plate (i.e., the holding plate) used in the conventional polishing head disclosed in PTL 1; and a ceramic plate single body and a fixed ceramic plate (i.e., the holding plate 33) used in the polishing head 10 of the first embodiment.

TABLE 2 shows height differences (P-V values) of the shape measuring results of the conventional polishing head disclosed in PTL 1 and the polishing head 10 of the first embodiment.

Figure 10:
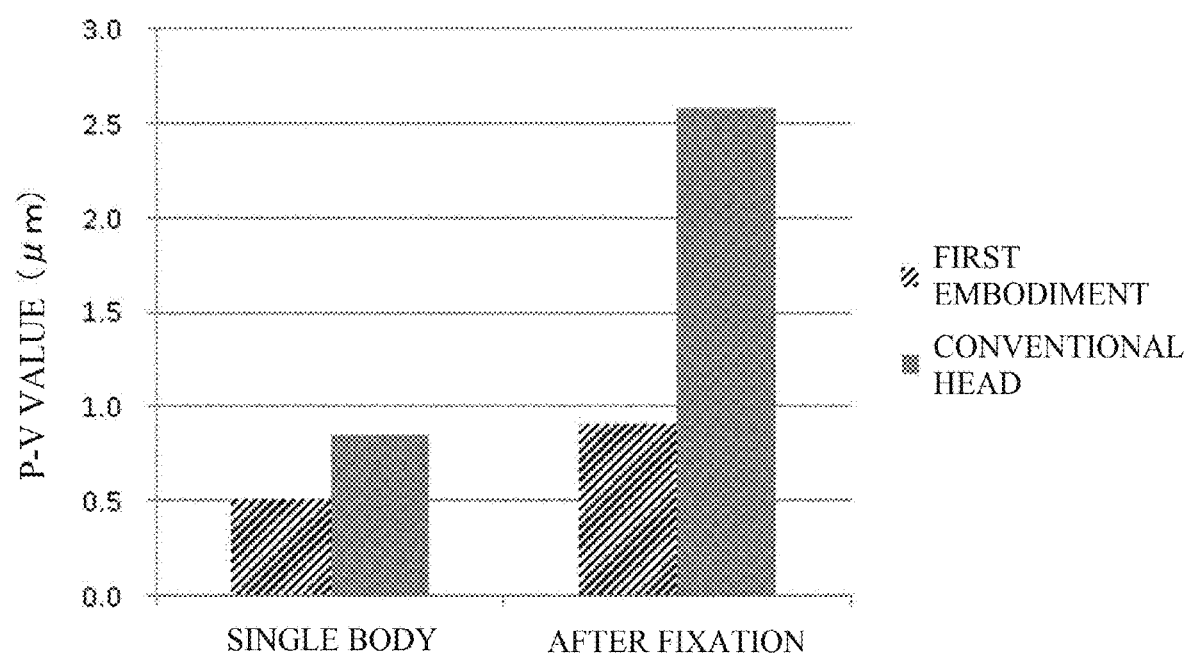
FIG. 10 is a graph showing height differences (P-V values) of the shape measuring results relating to the polishing head of the first embodiment and the conventional polishing head.

In case of the conventional polishing head, the measured value of the ceramic plate single body was 0.848 µm, and that of the fixed ceramic plate was 2.581 µm, so the shape was deteriorated. On the other hand, in the first embodiment, the measured value of the ceramic plate single body was 0.504 µm, and that of the fixed ceramic plate was 0.915 µm, so the shape deterioration was restrained (see FIG. 10).

This advantage was obtained by providing the elastic member having the X-shaped section between the fixing member 38 and the holding plate 33 to release a force, so that distorting the holding plate 33 was prevented.

Further, in the conventional polishing head, an O-ring is provided between the carrier main body part and the holding plate; on the other hand, in the first embodiment, the ring-shaped elastic body 36a is provided between the carrier main body part 30 and the holding plate 33, so it is thought that a force is dispersed by the X-shaped section.

TABLE 2

|  | First Embodiment | Conventional Polishing Head |
| --- | --- | --- |
| Ceramic Plate Single Body | 0.508 | 0.848 |
| Fixed Ceramic Plate | 0.915 | 2.581 | unit: µm

Figure 11:
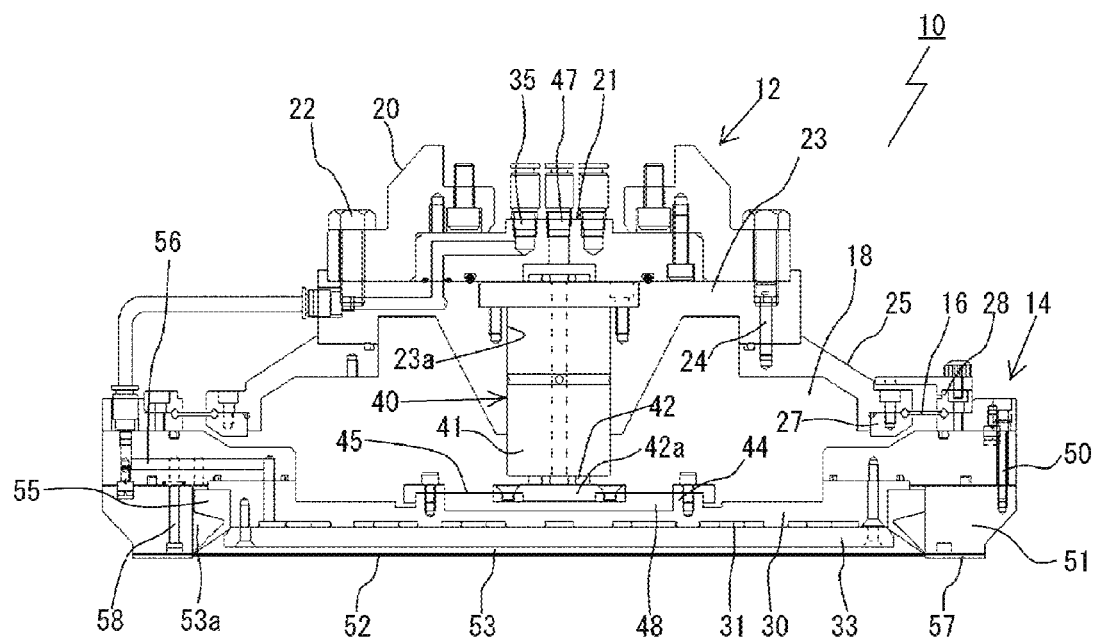
FIG. 11 is a sectional view of the polishing head of a second embodiment.

FIG. 11 is a sectional view of the polishing head 10 of a second embodiment. Structural elements explained in the first embodiment are assigned the same symbols, and explanation will be omitted.

In the second embodiment, only a structure of the carrier 14 is different from the first embodiment.

The carrier 14 includes: the carrier main body part 30; the holding plate 33, which is attached to the lower face of the carrier main body part 30 with forming the air chambers 31 and which has a plurality of through-holes (not shown) being communicated to the air chambers 31 and opened in the lower face; a retainer ring 51 being provided to an outer circumference of the lower face of the carrier main body part 30 and fixed by bolts 50; an elastic membrane member 52 having an outer circumferential part, the elastic membrane member 52 covering the lower face of the holding plate 33 and being fixed to the retainer ring 51 at the outer circumferential part; a second pressure chamber 53 enclosed by the lower face of the holding plate 33, an inner circumferential face of the retainer ring 51 and an upper face of the elastic membrane member 52; and a flow path 56 for supplying air to the second pressure chamber 53 via the air chambers 31 and the through-holes (not shown) of the holding plate 33, the flow path 56 being communicated to the supply/discharge path 35.

In the second embodiment, a seal ring 55 whose section is formed into a V-shape widened outward divides the second pressure chamber 53 into an inner part and an outer part. Air can be supplied into the outer part 53a of the second pressure chamber 53 via a flow path (not shown).

The retainer ring 51 has a ring-shaped plastic template 57, which is adhered on a lower face of a main body part of the retainer ring 51. The retainer ring 51 (the template 57) encloses the work to be polished and contacts the polishing pad of the polishing plate, while polishing the work, so as to press the polishing pad. With this structure, jumping out of the work and excessive polishing of an outer circumference of the work can be prevented.

Further, a flow path 58 for partially pressing the template 57 is formed in the main body part of the retainer ring and opened in a lower face thereof. By supplying compressed air into the flow path 58, the template 57 is partially pressed onto the polishing pad with a greater force, so that jumping out of the work can be further suitably prevented.

While polishing the work, the pressing force from the first pressure chamber 18 and the pressing force from the second pressure chamber 53 are applied to the work. Further, there is an advantage that the work can be evenly pressed by the pressing force from the second pressure chamber 53 through the elastic membrane member 52.

In the second embodiment too, the rotational force of the head main body part 12 is transmitted by the linear motion guide 40 and the rotation transmitting plate 45 as well as the first embodiment. Further, the carrier 14 is guided by the liner motion guide 40, and its height from the head main body part 12 can be varied. The carrier 14 can be tiltably supported by the rotation transmitting plate 45. With this structure, polishing accuracy of the work can be improved.

Measured data of variation ratios of load applied from the carrier to the polishing pad relating to the conventional polishing head disclosed in PTL 1 and the polishing head 10 of the second embodiment are shown in TABLE 3.

Note that, in case of the conventional polishing head of PTL 1, the position at which the elastic plate is in the horizontal state is the standard position; in case of the polishing head 10 of the second embodiment, a position at which the diaphragm 16 is in a horizontal state is a standard position. In each of cases, the variation ratio is a ratio of varying load with respect to load at the standard position when the head main body part is moved upward and downward from the standard position. In TABLE 3, an item "0.5 mm up" means that the head main body part is located at a position 0.5 mm higher than the standard position; and an item "0.5 mm down" means that the head main body part is located at a position 0.5 mm lower than the standard position. Note that, a fluid pressure in the pressure chamber was varied within a practical range, and it was considered that the obtained load was up to about 350 kgf.

TABLE 3

|  | Second Embodiment | Conventional Polishing Head |
| --- | --- | --- |
| 0.5 mm up | −0.54% | −1.18% |
| 1.0 mm up | −1.09% | −2.94% |
| 1.5 mm up | −1.63% | −5.29% |
| 0.5 mm down | 0.27% | 0.59% |

TABLE 3-continued

|  | Second Embodiment | Conventional Polishing Head |
| --- | --- | --- |
| 1.0 mm down | 0.54% | 1.47% |
| 1.5 mm down | 0.82% | 2.06% |

As clearly known from TABLE 3, in the polishing head 10 of the second embodiment, even if the height of the head main body part 12 was varied, the variation of the load applied to the polishing pad was small. In case of the second embodiment too, the carrier 14 is connected to the spline shaft 42 and capable of vertically moving with respect to the head main body part 12. Thus, the variation of the load applied to the polishing pad was very small with respect to the vertical movement of the head main body part 12. On the other hand, in case of the conventional polishing head, tension of the tough elastic plate was varied when the height of the head main body part is varied, so the variation of tension affected the carrier connected to the elastic plate and the variation of the load applied to the polishing pad was large.

In each of the polishing head of each of the first and second embodiments, when the height from the head main body part to the carrier was varied from the standard position within the range of ±1.5 mm, the variation of the load applied to the polishing head was not greater than ±2% with respect to the load applied when the height is the standard value. Therefore, in case of controlling the height of the head main body part (the height from the head main body part to the carrier) while polishing the work, even if the range greater than ±1.5 mm is allowed, tension of the diaphragm less affects the load applied to the polishing pad, so that the stable operation can be performed and the polishing head can be easily used.

In the polishing head of each of the embodiments relating to the present invention, the head main body part 12 can be moved upward and downward, and its height position (the height from the head main body part to the carrier) is adjustably fixed. It is preferable that the height position (height) is adjusted by adjusting means (vertical driving means), e.g., servo actuator. Further, the height position may be adjusted by clamping a height adjusting plate with other adjusting means (e.g., cylinder unit). However, it is difficult to precisely control the height position of such height adjusting plate.

In the conventional polishing head, if the height position cannot be precisely adjusted, there is a possibility that a problem of, for example, unstable load will be caused by tension of the plate-shaped elastic member (diaphragm).

Namely, by employing the polishing head of each of the embodiments of the present invention, even if the cylinder unit is used, the load can be stable and the precise polishing can be performed.

What is claimed is:

1. A polishing head, which holds a work on a lower face and presses the work on a polishing pad of a rotating polishing plate, comprising:
a head main body part;
a carrier having a lower face on which the work can be held, the carrier being connected to the head main body part with a ring-shaped flexible diaphragm;
a pressure chamber enclosed by a lower face of the head main body part, the diaphragm and an upper face of the carrier;

a fluid supplying section for supplying a fluid to the pressure chamber;

a linear motion guide having an outer cylindrical body, which is fixed to the head main body part and coaxially arranged therewith, and a spline shaft, which is provided in the outer cylindrical body and capable of moving in an axial direction thereof, and which is prohibited to rotate, about an axis, with respect to the outer cylindrical body so as to transmit a rotational force to the spline shaft through the outer cylindrical body; and a rotation transmitting plate being provided between a lower end of the spline shaft and the upper face of the carrier, the rotation transmitting plate being capable of tiltably supporting the carrier and transmitting a rotational force of the spline shaft to the carrier.

2. The polishing head according to claim 1,
wherein the linear motion guide is a ball-spline.

3. The polishing head according to claim 1,
wherein the rotation transmitting plate is a ring-shaped plate, which is connected to a flange part provided to the lower end of the spline shaft and an upper edge of a cylindrical part provided in the upper face of the carrier.

4. The polishing head according to claim 2,
wherein the rotation transmitting plate is a ring-shaped plate, which is connected to a flange part provided to the lower end of the spline shaft and an upper edge of a cylindrical part provided in the upper face of the carrier.

5. The polishing head according to claim 3,
wherein a chamber formed between the flange part, the rotation transmitting plate, the cylindrical part and the upper face of the carrier is communicated to the pressure chamber.

6. The polishing head according to claim 4,
wherein a chamber formed between the flange part, the rotation transmitting plate, the cylindrical part and the upper face of the carrier is communicated to the pressure chamber.

7. The polishing head according to claim 1,
wherein the carrier includes:
a carrier main body part;
a holding plate, which is attached to a lower face of the carrier main body part with forming an air chamber and which has a plurality of through-holes being communicated to the air chamber and opened in a lower face; and
a supply/discharge path for supplying air to and discharging air from the air chamber.

8. The polishing head according to claim 7,
wherein the holding plate is a ceramic plate, which is attached to the carrier main body part with a ring-shaped elastic body having an X-shaped section.

9. The polishing head according to claim 1,
wherein the carrier includes:
a carrier main body part;
a holding plate, which is attached to a lower face of the carrier main body part with forming an air chamber and which has a plurality of through-holes being communicated to the air chamber and opened in a lower face;
a retainer ring being provided to an outer circumference of a lower face of the carrier main body part, the retainer ring enclosing the work and contacting the polishing pad of the polishing plate while polishing the work;
an elastic membrane member covering the lower face of the holding plate and being fixed to the retainer ring at an outer circumferential part;
a second pressure chamber enclosed by the lower face of the holding plate, an inner circumferential face of the retainer ring and an upper face of the elastic membrane member; and
a flow path for supplying air to the second pressure chamber via the air chamber and the through-holes.

10. The polishing head according to claim 9,
wherein the retainer ring has a ring-shaped template, which encloses the work and contacts the polishing pad of the polishing plate while polishing the work.

11. The polishing head according to claim 10,
wherein the retainer ring has a flow path for pressing the template by a fluid pressure.

12. The polishing head according to claim 1,
wherein the linear motion guide prohibits side shift of the carrier, which is caused by a frictional force while polishing, and centers the same.

13. The polishing head according to claim 2,
wherein the linear motion guide prohibits side shift of the carrier, which is caused by a frictional force while polishing, and centers the same.

14. The polishing head according to claim 1,
wherein the head main body part and the carrier are connected to each other by a flexible diaphragm,
a height from the head main body part to the carrier can be varied,
the height is varied within a range of ±1.5 mm, and
an amount of varying a load applied to the polishing pad after varying the height is within ±2% with respect to the load applied when the height is a standard value.

15. The polishing head according to claim 1,
wherein when a height of the head main body part is adjusted for polishing the work, the height of the head main body part is allowed to vary within ±1.5 mm from a standard position, and a load applied when the height of the head main body part is located at the standard position can be maintained.

* * * * *